US007589271B2

(12) United States Patent
Jarrett et al.

(10) Patent No.: US 7,589,271 B2
(45) **Date of Patent: *Sep. 15, 2009**

(54) MUSICAL NOTATION SYSTEM

(75) Inventors: Jack Marius Jarrett, Greensboro, NC (US); Lori Jarrett, Greensboro, NC (US); Ramasubramaniyam Sethuraman, Greensboro, NC (US); Rangarajan Krishnaswami, Greensboro, NC (US); Anand Shankar Krishnamoorthi, Greensboro, NC (US)

(73) Assignee: Virtuosoworks, Inc., Greensboro, NC (US)

( * ) Notice: Subject to any disclaimer, the term of this patent is extended or adjusted under 35 U.S.C. 154(b) by 650 days.

This patent is subject to a terminal disclaimer.

(21) Appl. No.: 11/262,312

(22) Filed: Oct. 28, 2005

(65) Prior Publication Data

US 2006/0086234 A1 Apr. 27, 2006

Related U.S. Application Data

(63) Continuation-in-part of application No. 10/460,042, filed on Jun. 11, 2003, now Pat. No. 7,105,733.

(60) Provisional application No. 60/387,808, filed on Jun. 11, 2002.

(51) Int. Cl.
*G09B 15/02* (2006.01)
*G10H 7/00* (2006.01)
*G11C 1/00* (2006.01)
*H03M 1/00* (2006.01)

(52) U.S. Cl. ........................... 84/601; 84/612; 84/483.2

(58) Field of Classification Search ................ 84/483.2, 84/601, 603, 609, 612, 633
See application file for complete search history.

(56) References Cited

U.S. PATENT DOCUMENTS 4,085,648 A 4/1978 Fricke et al.

(Continued)

FOREIGN PATENT DOCUMENTS

EP 0 632 427 A 1/1995

(Continued)

OTHER PUBLICATIONS

Boehm C. et al: "Musical tagging type definitions, systems for music representation and retrieval" EUROMICRO Conference, 20000. Proceedings of the 26$^{TH}$ Sep. 5-7, 20000, Los Alamitos, CA, USA, IEEE Comput. Soc, US, Sep. 5, 2000, pp. 34-347, XP010514263; IBSN: 0-7695-0780-8, p. 341, right-hand column, paragraph 3, p. 344, left-hand column, paragraph 5.

(Continued)

*Primary Examiner*—Jeffrey Donels
(74) *Attorney, Agent, or Firm*—Smith Moore Leatherwood LLP

(57) ABSTRACT

An integrated system and software package for creating and performing a musical score including a user interface that enables a user to enter and display the musical score, a database that stores a data structure which supports graphical symbols for musical characters in the musical score and performance generation data that is derived from the graphical symbols, a musical font that includes a numbering system that corresponds to the musical characters, a compiler that generates the performance generation data from the database, a performance generator that reads the performance generation data from the compiler and synchronizes the performance of the musical score, and a synthesizer that responds to commands from the performance generator and creates preassembled data for acoustical playback of the musical score that is output to a sound generation device. The synthesizer generates the data for acoustical playback from a proprietary library of digital sound samples.

30 Claims, 1 Drawing Sheet

U.S. PATENT DOCUMENTS

| | | | | |
|---|---|---|---|---|
| 4,960,031 | A * | 10/1990 | Farrand | 84/609 |
| 5,146,833 | A * | 9/1992 | Lui | 84/462 |
| 5,202,526 | A * | 4/1993 | Ohya | 84/462 |
| 5,315,057 | A * | 5/1994 | Land et al. | 84/601 |
| 5,488,196 | A * | 1/1996 | Zimmerman et al. | 84/612 |
| 5,744,742 | A | 4/1998 | Lindemann et al. | |
| 5,773,741 | A * | 6/1998 | Eller et al. | 84/609 |
| 6,208,969 | B1 | 3/2001 | Curtin | |
| 6,235,979 | B1 * | 5/2001 | Yanase | 84/477 R |
| 6,281,420 | B1 * | 8/2001 | Suzuki et al. | 48/477 R |
| 6,355,871 | B1 * | 3/2002 | Yamauchi | 84/609 |
| 7,105,733 | B2 * | 9/2006 | Jarrett et al. | 84/601 |
| 2004/0025668 | A1 | 2/2004 | Jarrett et al. | |
| 2006/0254407 | A1 | 11/2006 | Jarrett et al. | |

FOREIGN PATENT DOCUMENTS

| | | |
|---|---|---|
| WO | WO 01 01296 A | 1/2001 |
| WO | PCT/US03/18264 | 6/2003 |
| WO | 03105122 A1 | 12/2003 |

OTHER PUBLICATIONS

Database Inspec Online! Institute of Electrical Engineers, Stevenage, GB; Belkin A: "Macintosh notation software: present and future" Database accession No. 4697149, XP009018261, p. 62, right-hand column, paragraph 2, p. 69: table 1, *& Computer Music Journal, Spring 1994, USA, vol. 18, No. 1, pp. 53-69, ISSN 0148-9267.

Database Inspec Online! Institute of Electrical Engineers, Stevenage, GB; Grande C et al: "The development of the Notation Interchange File Format" Database accession No. 5508877, XP009018119, p. 35—p. 42 & Computer Music Journal, Winter 1996, MIT Press, USA, vol. 20, No. 4, pp. 33-43, ISSN: 0148-9267.

Mozart music software, FAQ, Dec. 7, 1996.

International Preliminary Report on Patentability mailed on May 8, 2008 in PCT/US2006/060269.

Written Opinion of the International Searching Authority mailed on May 8, 2008 in PCT/US2006/060269.

Peter Alexander, "Notion Music: No MIDI Knowledge Required," Sonic Control Online Magazine. May 29, 2008.

Francine Russo, "Making Musical History," Time Magazine, copyright 2006.

Supplementary European Search Report completed on Dec. 15, 2006 in connection with Application No. EP 06019062.6.

International Search Report mailed on Oct. 19, 2007 in PCT/US2007/068219.

Written Opinion of the International Searching Authority mailed on Oct. 19, 2007 in PCT/US2007/068219.

International Search Report mailed on Sep. 6, 2007 in PCT/US2006/060269.

Written Opinion of the International Searching Authority mailed on Sep. 6, 2007 in PCT/US2006/060269.

Adriano Barate, Goffredo Haus, Luca A. Ludovico and Giancarlo Vercellesi, MXDemo: a Case Study about Audio, Video, and Score Synchronization, article, Copyright 2005, pp. 45-52, XP010892434, ISBN: 0-7695-2348-X, Proceedings of the First International Conference on Florence, Italy, Nov. 2-30, 2005, Piscataway, NJ, USA on Automated Production of Cross Media Content for Multi-Channel Distribution, AXMEDIS, The Computer Society.

Pierfrancesco Bellini and Paolo Nesi, Wedelmusic Format: an XML Music Notation Format for Emerging Applications, article, Copyright Nov. 23, 2001, pp. 84-91, XP010582769, ISBN: 0-7695-1284-4, Proceedings of the First International Conference on Nov. 23-24, 2001, Piscataway, NJ, USA, on Web Delivering of Music, The Computer Society.

* cited by examiner

MUSICAL NOTATION SYSTEM

This application is a continuation-in-part of U.S. patent application Ser. No. 10/460,042, filed on Jun. 11, 2003 now U.S. Pat. No. 7,105,733, which claims the benefit of U.S. Provisional Application No. 60/387,808, filed on Jun. 11, 2002.

BACKGROUND OF THE INVENTION

The present invention is directed towards musical software, and, more particularly, towards a system that integrates musical notation technology with a unique performance generation code and synthesizer to provide realistic playback of musical scores.

Since the mid-1980's, the music notation, music publishing, and pro-audio industry has undergone significant and fundamental change. Technological advances in both computer hardware and software have enabled the development of several software products designed to automate digital music production, such as software synthesizers. Today, both FM and sampling synthesizers are generally available in software form. Another example is the evolution of emulation of acoustical instruments. Using the most advanced instruments and materials on the market today, such as digital sampling synthesizers, high-fidelity multi-track mixing and recording techniques, and expensively recorded sound samples, it is possible to emulate the sound and effect of a large ensemble playing complex music, (such as orchestral works) to an amazing degree. Such emulation, however, is restricted by a number of MIDI-imposed limitations.

Musical Instrument Digital Interface (MIDI) is an elaborate system of control, which is capable of specifying parameters of live musical performance. Digital performance generators, which employ recorded sounds referred to as "samples" of live musical instruments under MIDI control, are theoretically capable of duplicating the effect of live performance.

Effective use of MIDI has mostly been in the form of sequencers, which are computer programs that can record and playback the digital controls generated by live performance on a digital instrument. By sending the same controls back to the digital instrument, the original performance can be duplicated. Sequencers allow several "tracks" of such information to be individually recorded, synchronized, and otherwise edited, and then played back as a multi-track performance. Because keyboard synthesizers play only one "instrument" at a time, such multi-track recording is necessary when using MIDI code to generate a complex, multi-layered ensemble of music.

While it is theoretically possible to create digital performances that mimic live acoustic performances by using a sequencer in conjunction with a sophisticated sample-based digital performance generator, there are a number of problems that limit its use in this way.

First, the instrument most commonly employed to generate such performances is a MIDI keyboard. Similar to other keyboard instruments, a MIDI keyboard is limited in its ability to control the overall shapes, effects, and nuances of a musical sound because it acts primarily as a trigger to initiate the sound. For example, a keyboard cannot easily achieve the legato effect of pitch changes without "re-attack" to the sound. Even more difficult to achieve is a sustained crescendo or diminuendo within individual sounds. By contrast, orchestral wind and string instruments maintain control over the sound throughout its duration, allowing for expressive internal dynamic and timbre changes, none of which are easily achieved with a keyboard performance. Second, the fact that each instrument part must be recorded as a separate track complicates the problem of moment-to-moment dynamic balance among the various instruments when played back together, particularly as orchestral textures change. Thus, it is difficult to record a series of individual tracks in such a way that they will synchronize properly with each other. Sequencers do allow for tracks to be aligned through a process called quantization, but quantization removes any expressive tempo nuances from the tracks. In addition, techniques for editing dynamic change, dynamic balance, legato/staccato articulation, and tempo nuance that are available in most sequencers are clumsy and tedious, and do not easily permit subtle shaping of the music.

Further, there is no standard for sounds that is consistent from one performance generator to another. The general MIDI standard does provide a protocol list of names of sounds, but the list is inadequate for serious orchestral emulation, and, in any case, is only a list of names. The sounds themselves can vary widely, both in timbre and dynamics, among MIDI instruments. Finally, general MIDI makes it difficult to emulate a performance by an ensemble of over sixteen instruments, such as a symphony orchestra, except through the use of multiple synthesizers and additional equipment, because of the following limitations:

- MIDI code supports a maximum of sixteen channels. This enables discreet control of only sixteen different instruments (or instrument/sound groups) per synthesizer. To access more than sixteen channels at a time, the prior art systems using MIDI require the use of more than one hardware synthesizer, and a MIDI interface that supports multiple MIDI outputs.
- MIDI code does not support the loading of an instrument sound file without immediately connecting it to a channel. This requires that all sounds to be used in a single performance be loaded into the synthesizer(s) prior to a performance.
- In software synthesizers, many instrument sounds may be loaded and available for potential use in combinations of up to sixteen at a time, but MIDI code does not support dynamic discarding and replacement of instrument sounds as needed. This also causes undue memory overhead.
- MIDI code allows a maximum of 127, scaled volume settings, which, at lower volume levels, often results in a "bumpy" volume change, rather than the desired, smooth volume change.
- MIDI code supports pitch bend only by channel, and not on a note-by-note basis. Any algorithmic pitch bends cannot be implemented via MIDI, but must be set up as a patch parameter in the synthesizer. The prior art systems using MIDI also include a pitch wheel, which bends the pitch in real time, based on movements of the wheel by the user.
- MIDI code supports panning and pedal commands only by channel, and not on a note-by-note basis.
- MIDI code is serial in nature, transmitting only one command at a time (such as a command to turn a note on). Consequently, a MIDI instrument cannot assemble all the notes of a chord into a single event, but must begin each note separately, resulting in an audible "ripple" effect when large numbers of notes are involved.

In view of the forgoing, consumers desiring to produce high-quality digital audio performances of music scores must still invest in expensive equipment and then grapple with problems of interfacing the separate products. Because this integration results in different combinations of notation software, sequencers, sample libraries, software and hardware synthesizers, there is no standardization that ensures that the generation of digital performances from one workstation to another will be identical. Prior art programs derive music performances from notation send performance data in the form of MIDI commands to either an external MIDI synthesizer or to a general MIDI sound card on the current computer workstation, with the result that no standardization of output can be guaranteed. For this reason, people who desire to share a digital musical performance with someone in another location must create and send a recording.

Sending a digital sound recording over the Internet leads to another problem because music performance files are notoriously large. There is nothing in the prior art to support the transmission of a small-footprint performance file that generates a high-quality, identical audio from music notation data alone. There is no mechanism to provide realistic digital music performances of complex, multi-layered music through a single personal computer, with automatic interpretation of the nuances expressed in music notation, at a single instrument level.

Accordingly, there is a need in the art for a music performance system based on the universally understood system of music notation, that is not bound by MIDI code limitations, so that it can provide realistic playback of scores on a note-to-note level while allowing the operator to focus on music creation, not sound editing. There is a further need in the art for a musical performance system that incorporates specialized synthesizer functions to respond to control demands outside of the MIDI code limitations and provides specialized editing functions to enable the operator to manipulate those controls. Additionally, there is a need in the art to provide all of these functions in a single software application that eliminates the need for multiple external hardware components.

BRIEF DESCRIPTION OF THE FIGURES

The present invention is better understood by a reading of the Detailed Description of the Invention along with a review of the drawing, in which.

DETAILED DESCRIPTION OF THE INVENTION

Figure 1:
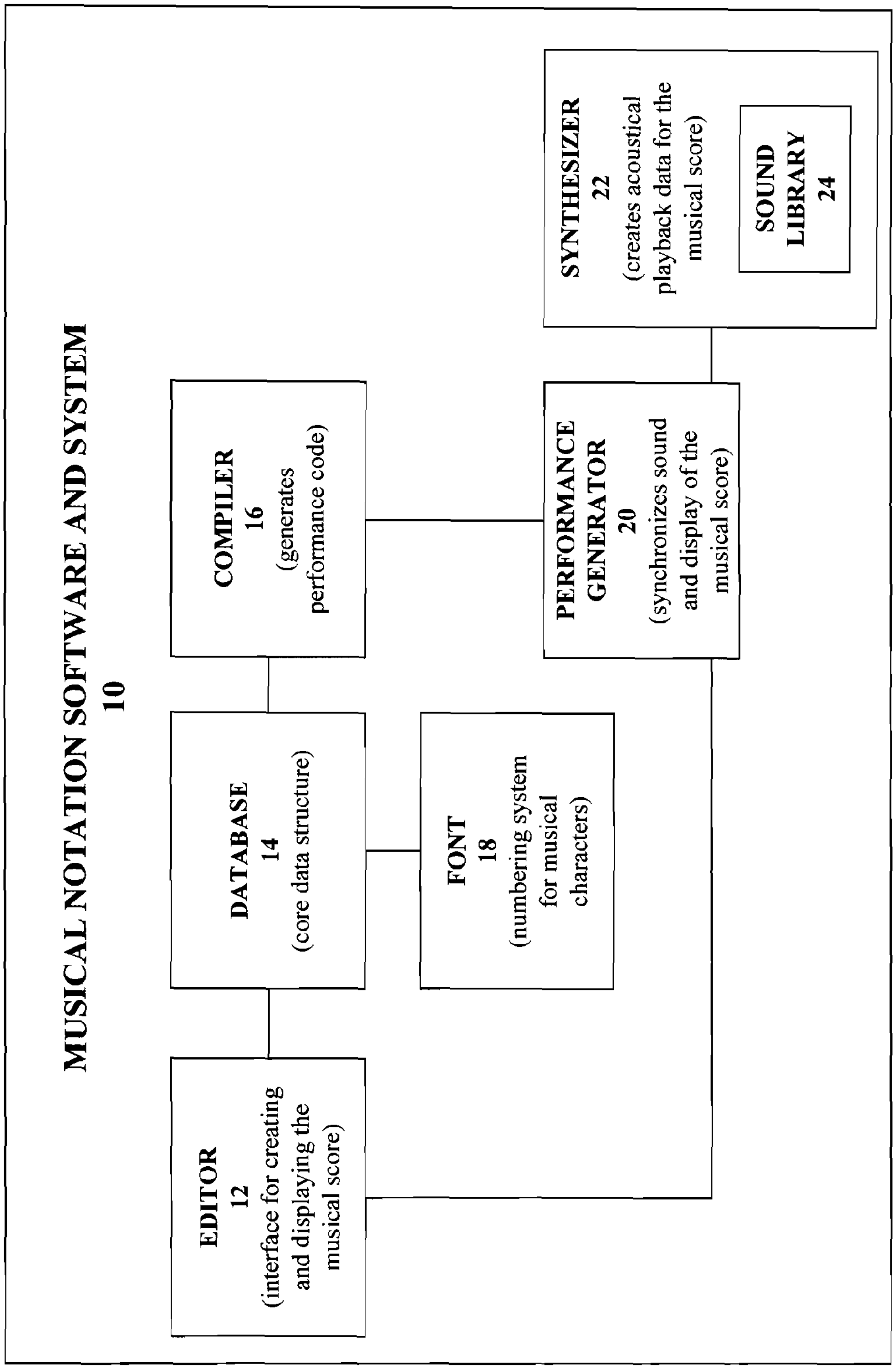
FIG. 1 is a block diagram of the musical notation system of the present invention.

The present invention provides a system that integrates music notation technology with a unique performance generation code and a synthesizer pre-loaded with musical instrument files to provide realistic playback of music scores. The invention integrates these features into a single software application that until now has been achieved only through the use of separate synthesizers, mixers, and other equipment. The present invention automates performance generation so that it is unnecessary for the operator to be an expert on using multiple, specialized pieces of equipment. Thus, the present invention requires that the operator simply have a working knowledge of computers and music notation.

The software and system of the present invention comprises six general components: a musical entry interface for creating and displaying musical score files (the "editor") 12, a data structure optimized for encoding musical graphic and performance data (the "database") 14, a music font optimized for both graphic representation and music performance encoding (the "font") 18, a set of routines that generate performance code data from data in the database (the "compiler") 16, a performance generator that reads the performance code data and synchronizes the on screen display of the performance with the sound ("performance generator") 20, and a software synthesizer (the "synthesizer") 22.

Editor (12)

Referring now to the editor, this component of the software is an intuitive user interface for creating and displaying a musical score. A musical score is organized into pages, systems, staffs and bars (measures). The editor of the present invention follows the same logical organization except that the score may consist of only one continuous system, which may be formatted into separate systems and pages as desired prior to printing.

The editor vertically organizes a score into staff areas and staff degrees. A staff area is a vertical unit which normally includes a musical staff of one or more musical lines. A staff degree is the particular line or space on a staff where a note or other musical character may be placed. The editor's horizontal organization is in terms of bars, rhythmic positions, and columns. A bar is a rhythmic unit, usually conforming to the metric structure indicated by a time signature, and delineated on either side by a bar line. A rhythmic position is a point within a bar where a note or rest may occur. A column is an invisible horizontal unit. Columns extend vertically throughout the system, and are the basis for vertical alignment of musical characters. Rhythmic positions are used for determination of time-events within the score.

The editor incorporates standard word-processor-like block functions such as cut, copy, paste, paste-special, delete, and clear, as well as word-processor-like formatting functions such as justification and pagination. The editor also incorporates music-specific block functions such as overlay, transpose, add or remove beams, reverse or optimize stem directions, and divide or combine voices, etc. Music-specific formatting options are further provided, such as pitch respelling, chord optimization, vertical alignment, rhythmic-value change, insertion of missing rests and time signatures, placement of lyrics, and intelligent extraction of individual instrumental or vocal parts. While in the client workspace of the editor, the cursor alternates, on a context-sensitive basis, between a blinking music character restricted to logical locations on the musical staff ("columns" and "staff degrees") and a non-restricted pointer cursor.

Unlike prior art musical software systems, the editor of the present invention enables the operator to double-click on a character in a score to automatically cause that character to become a new cursor character. This enables complex cursor characters, such as chords, octaves, and thirds, etc. to be selected into the cursor, which is referred to as cursor character morphing. Thus, the operator does not have to enter each note in the chord one at a time or copy, paste, and move a chord, both of which require several keystrokes.

The editor of the present invention also provides an automatic timing calculation feature that accepts operator entry of a desired elapsed time for a musical passage. This is important to the film industry, for example, where there is a need to calculate the speed of musical performances such that the music coordinates with certain "hit" points in films, television, and video. The prior art practices involve the composer approximating the speeds of different sections of music using metronome indications in the score. For soundtrack creation, performers use these indications to guide them to arrive on time at "hit" points. Often, several recordings are required before the correct speeds are accomplished and a correctly-timed recording is made. The editor of the present invention eliminates the need for making several recordings by calculating the exact tempo needed. The moving playback cursor for a previously-calculated playback session can be used as a conductor guide during recording sessions with live performers. This feature allows a conductor to synchronize the live conducted performance correctly without the need for conventional click tracks, punches or streamers.

Unlike prior art, tempo nuances are preserved even when overall tempo is modified, because tempo is controlled by adjusting the note values themselves, rather than the clock speed (as in standard MIDI.) The editor preferably uses a constant clock speed equivalent to a metronome mark of 140. The note values themselves are then adjusted in accordance with the notated tempo (i.e., quarter notes at an andante speed are longer than at an allegro speed.) All tempo relationships are dealt with in this way, including fermatas, tenutos, breath commas and break marks. The clock speed can then be changed globally, while preserving all the inner tempo relationships.

After the user inputs the desired elapsed time for a musical passage, global calculations are performed on the stored duration of each timed event within a selected passage, thereby preserving variable speeds within the sections (such as ritardandos, accelerandos, a tempi), if any, to arrive at the correct timing for the overall section. Depending on user preference, metronome markings may either be automatically updated to reflect the revised tempi, or they may be preserved, and kept "hidden," for playback only. The editor calculates and stores the duration of each musical event, preferably in units of $1/44100$ of a second. Each timed event's stored duration is then adjusted by a factor (x=current duration of passage/desired duration of passage) to result in an adjusted overall duration of the selected passage. A time orientation status bar in the interface may show elapsed minutes, seconds, and SMPTE frames or elapsed minutes, seconds, and hundredth of a second for the corresponding notation area.

The editor of the present invention further provides a method for directly editing certain performance aspects of a single note, chord, or musical passage, such as the attack, volume envelope, onset of vibrato, trill speed, staccato, legato connection, etc. This is achieved by providing a graphical representation that depicts both elapsed time and degrees of application of the envelope. The editing window is preferably shared for a number of micro-editing functions. An example of the layout for the user interface is shown below in Table 1.

TABLE 1

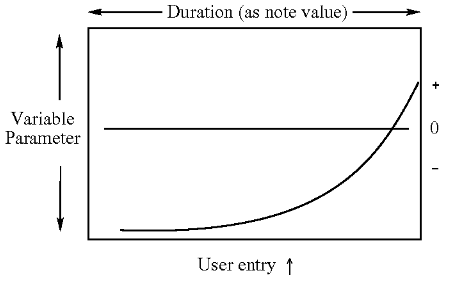

The editor also provides a method for directly editing panning motion or orientation on a single note, chord or musical passage. The editor supports two and four-channel panning. The user interface may indicate the duration in note value units, by the user entry line itself, as shown in Table 2 below.

TABLE 2

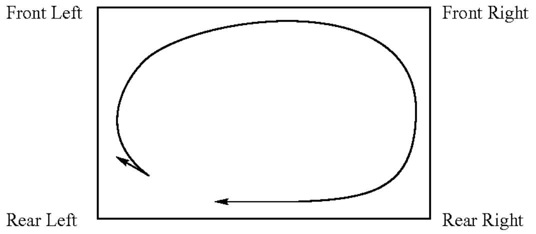

Prior art musical software systems support the entry of MIDI code and automatic translation of MIDI code into music notation in real time. These systems allow the user to define entry parameters (pulse, subdivision, speed, number of bars, starting and ending points) and then play music in time to a series of rhythmic clicks, used for synchronization purposes. Previously-entered music can also be played back during entry, in which case the click can be disabled if unnecessary for synchronization purposes. These prior art systems, however, make it difficult to enter tuplets (or rhythmic subdivisions of the pulse which are notated by bracketing an area, indicating the number of divisions of the pulse). Particularly, the prior art systems usually convert tuplets into technically correct, yet highly-unreadable notation, often notating minor discrepancies in the rhythm that the user did not intend, as well.

The editor of the present invention overcomes this disadvantage while still translating incoming MIDI into musical notation in real time, and importing and converting standard MIDI files into notation. Specifically, the editor allows the entry of music data via a MIDI instrument, on a beat-by-beat basis, with the operator determining each beat point by pressing an indicator key or pedal. Unlike the prior art, in which the user must time note entry according to an external click track, this method allows the user to play in segments of music at any tempo, so long as he remains consistent within that tempo during that entry segment. This method has the advantage of allowing any number of subdivisions, tuplets, etc. to be entered, and correctly notated.

Database (14)

The database is the core data structure of the software system of the present invention. It contains, in concise form, the information for writing the score on a screen or to a printer, and/or generating a musical performance. In particular, the database of the present invention provides a sophisticated data structure that supports the graphical symbols and information that is part of a standard musical score, as well as the performance generation information that is implied by the graphical information and is produced by live musicians during the course of interpreting the graphical symbols and information in a score.

The code entries of the data structure are in the form of 16-bit words, generally in order of Least Significant Bit (LSB) to Most Significant Bit (MSB), as follows:

0000h (0)-003Fh (63) are Column Staff Markers 0040h (64)-00FFh (255) are Special Markers 0100h (256)-0FEFFh (65279) are Character ID's together with Staff Degrees 0FF00h (65280)-0FFFFh (65535) are Data Words. Only the LSB is the datum.

Character ID's are arranged into "pages" of 256 each.

Character ID's are the least significant 10 bits of the two-byte word. The most significant 6 bits are the staff degree.

Individual Characters consist of: Character ID and Staff Degree combined into a single 16-bit word.

Specific markers are used in the database to delineate logical columns and staff areas, as well as special conditions such as the conclusion of a graphic or performance object. Other markers may be used to identify packets, which are data structures containing graphic and/or performance information organized into logical units. Packets allow musical objects to be defined and easily manipulated during editing, and provide information both for screen writing and for musical performance. Necessary intervening columns are determined by widths and columnar offsets, and are used to provide distance between adjacent objects. Alignment control and collision control are functions which determine appropriate positioning of objects and incidental characters in relation to each other vertically and horizontally, respectively.

Unlike prior art music software systems, the database of the present invention has a small footprint so it is easily stored and transferred via e-mail to other workstations, where the performance data can be derived in real time to generate the exact same performances as on the original workstation. Therefore, this database addresses the portability problem that exists with the prior art musical file formats such as .WAV and .MP3. These file types render identical performances on any workstation but they are extremely large and difficult to store and transport.

The database of the present invention also enables the system to read music XML files and convert them to a proprietary data format, and vice versa. XML is an extended markup language in which tags (descriptive verbal strings) are used to define the data which follows. Both tags and data are in verbal language, which provides readability at the expense of compactness and fast parsing capability. Music XML, in particular, has a high degree of redundancy, compounded by the fact that tags are often larger than data. The present invention can convert an XML file into a new file type which inherits the XML model while improving its weaknesses. The method involves storing all tags in a string table and substituting pointers for tags within the body of the file. The string table consists of only one copy of each tag, and is sorted according to the usage count of the tags. Those tags used most often are given a low number, which minimizes the number of bits used in the pointer, optimizing access to the tags and making optimum use of storage space, resulting in a significantly smaller file size.

Font (18)

The font of the present invention is a unicoded, truetype musical font that is optimal for graphic music representation and musical performance encoding. In particular, the font is a logical numbering system that corresponds to musical characters and glyphs that can be quickly assembled into composite musical characters in such a way that the relationships between the musical symbols are directly reflected in the numbering system. The font also facilitates mathematical calculations (such as for transposition, alignment, or rhythm changes) that involve manipulation of these glyphs. Hexadecimal codes are assigned to each of the glyphs that support the mathematical calculations. Such hexadecimal protocol may be structured in accordance with the following examples:

| | |
|---|---|
| 0 | Rectangle (for grid calibration) |
| 1 | Vertical Line (for staff line calibration) |
| 2 | Virtual bar line (non-print) |
| 3 | Left non-print bracket |
| 4 | Right non-print bracket |
| 5 | Non-print MIDI patch symbol |
| 6 | Non-print MIDI channel symbol |
| (7-FF) | reserved |
| 100 | single bar line |
| 101 | double bar line |
| 102 | front bar line |
| 103 | end bar line |
| 104 | stem extension up, 1 degree |
| 105 | stem extension up, 2 degrees |
| 106 | stem extension up, 3 degrees |
| 107 | stem extension up, 4 degrees |
| 108 | stem extension up, 5 degrees |
| 109 | stem extension up, 6 degrees |
| 10A | stem extension up, 7 degrees |
| 10B | stem extension up, 8 degrees |
| 10C | stem extension down, 1 degree |
| 10D | stem extension down, 2 degrees |
| 10E | stem extension down, 3 degrees |

Compiler (16)

The compiler component of the present invention is a set of routines that generates performance code from the data in the database, described above. Specifically, the compiler directly interprets the musical symbols, artistic interpretation instructions, note-shaping "micro-editing" instructions, and other indications encoded in the database, applies context-sensitive artistic interpretations that are not indicated through symbols and/or instructions, and creates performance-generation code for the synthesizer, which is described further below.

The performance generation code format includes the following enhancements for addressing the limitations of MIDI:

The code is in event-sequence form versus a serial form. All commands that are to occur simultaneously are grouped together, and each such group is assigned a single timing value.

Instrument change commands provide for up to 128 instruments and a variety of samples related to the instrument.

Sample preloading commands allow samples to be loaded into memory just before they are needed.

Sample cancellation commands allow samples to be released from memory when they are no longer needed.

Note-on commands specify envelope parameters, including accent and overall dynamic shape. This enhancement supports envelope shaping of individual notes.

Note-off commands specify decay shape. This enhancement supports envelope shaping of the note's release, including crossfading to the next note for legato connection.

Volume commands provide a much wider range of volume control than MIDI, eliminating "bumpy" changes, particularly at lower volumes. They replace the velocity and channel volume commands in the MIDI specification.

Pitch bend commands enable support of algorithmic pitch bend shaping of individual notes.

Pan commands support algorithmic surround sound panning (stationary and in motion).

Pedal commands support pedal capability on an individual note basis.

Special micro-editing commands allow a number of digital processing techniques to be applied on an individual note basis.

Timing commands are the number of digital samples processed at either 44.1 KHz or 96 KHz. This enhancement allows precision timing independent of the computer clock, and directly supports wave file creation. Thus, a one-second duration at 44.1 KHz is equal to 44,100 digital samples. The invention adjusts individual note values in accordance with the notated tempo (i.e., quarter notes at a slow speed are longer than quarter notes at a fast speed.) All tempo relationships are dealt with in this way, including fermatas, tenutos, breath commas and break marks. This enhancement allows the playback speed to be changed globally, while preserving all inner tempo relationships.

The invention interprets arpeggio, fingered tremolando, slide, glissando, beamed accelerando and ritardando groups, portamenteau symbols, trills, mordents, inverted mordents, staccato and other articulations, and breath mark symbols into performance generation code, including automatic selection of sample changes where required, as well as automatic selection of instrument-specific performance directions (such as pizzicato, col legno, etc.) and notational symbols indicating staccato, marcato, accent, or legato.

Because it is a completely integrated program, the invention is able to know in advance during real-time performance the musical sounds that are required, and to set them up accordingly prior to the moment of their performance.

The invention can create a standard audio data wave file directly to disk. It can do this in less time than a performance of the same material would take. It can also create a special audio data file that contains synchronized control information together with the sound data. This is currently used to control movement of the screen cursor and other display parameters during playback of such a file.

Thus, while prior art music notation software programs create a limited MIDI playback of the musical score, the present invention's rendering of the score into performance code is unique in the number and variety of musical symbols it translates, the efficiency with which it can preassemble the required sounds, the range of performance parameters it supports, and in the quality of performance it creates thereby.

Performance Generator (20)

The performance generator reads the proprietary performance code file created by the compiler, and sends commands to the software synthesizer and the screen-writing component of the editor at appropriate timing intervals, so that the score and a moving cursor can be displayed in synchronization with the playback. In general, the timing of the performances may come from four possible sources: (1) the internal timing code, (2) external MIDI Time Code (SMPTE), (3) user input from the computer keyboard or from a MIDI keyboard, and (4) timing information recorded during a previous user-controlled session. The performance generator also includes controls which allow the user to jump to, and begin playback from, any point within the score, and/or exclude any instruments from playback in order to select desired instrumental combinations.

When external SMPTE Code is used to control the timing, the performance generator determines the exact position of the music in relation to the video if the video starts within the musical cue, or waits for the beginning of the cue if the video starts earlier.

When user input times the performance, the present invention utilizes a method of controlling the performance in real time by the user to achieve results similar to a live conductor controlling the performance of live musicians. This method is referred to herein as "NTempo." A special user-created rhythm staff in the score provides the performance control rhythm. The user presses one of a set of designated computer keys in accordance with the notated NTempo rhythms to control the performance playback. In "normal" NTempo mode the performance jumps to the point of the next designated trigger press if the press is earlier than the current tempo predicts, and waits for the next trigger press if the press is later than the current tempo predicts. As each press is made, the current tempo is recalculated by slowing if the press is late or speeding up if the press is early. Since the calculated tempo changes constantly during the performance, the dynamic changes (volume changes indicated in the musical score as a hairpin or a Crescendo) are also modified based on the current tempo. This allows absolute user control over tempo on an event-by-event basis. Special controls also support repeated and "vamp until ready" passages, and provide easy transition from user control to automatic internal clock control (and vice versa) during playback. The user may elect to have such tempo change averaged over two or more successive presses. Users may create or edit the special music area to fit their own needs. Thus, this feature enables intuitive control over tempo in real time, for any trained musician, without requiring keyboard proficiency or expertise in sequencer equipment. The NTempo method makes it possible for the invention to perform in synchronization with live musicians, and to follow the lead of a conductor or soloist.

A variation of this performance control method, referred to as a "nudge mode," is similar to NTempo, except that the performance does not jump to or wait for the next trigger point when a key is pressed. Rather, the tempo is recalculated according to the timing of the press. If no key is pressed, playback continues in the currently-established tempo. "Nudge" mode, therefore, allows the tempo to be influenced without disturbing the ongoing flow of the performance.

The present invention also includes a technique of encoding and saving the timing of keypresses during an NTempo performance session, and subsequently using the stored information to control a playback. In this case, the timing of all user-keystrokes in the original session is stored for subsequent use as an automatic triggering control that renders an identically-timed performance.

Special marks placed in the NTempo rhythm staff allow the performance to (1) return immediately to the currently-notated tempo, (2) "capture" the tempo at a specific point during the performance, and (3) return immediately to such a "captured" tempo.

Synthesizer (22)

The software synthesizer responds to commands from the performance generator. It first creates digital data for acoustical playback, drawing on a library of digital sound samples. The sound sample library is a comprehensive collection of digital recordings of individual pitches (single notes) played by orchestral and other acoustical instruments. These sounds are recorded and constitute the "raw" material used to create the musical performances. The protocol for these preconfigured sampled musical sounds is automatically derived from the notation itself, and includes use of different attacks, releases, performance techniques and dynamic shaping for individual notes, depending on musical context.

The synthesizer then forwards the digital data to a direct memory access buffer shared by the computer sound card. The sound card converts the digital information into analog sound that may be output in stereo or quadraphonic, or orchestral seating mode. Unlike prior art software systems, however, the present invention does not require audio playback in order to create a WAVE or MP3 sound file. Rather, WAVE or MP3 sound files may be saved directly to disk.

The present invention also applies a set of processing filters and mixers to the digitally recorded musical samples stored as instrument files in response to commands in the performance generation code. This results in individual-pitch, volume, pan, pitchbend, pedal and envelope controls, via a processing "cycle" that produces up to three stereo 16-bit digital samples, depending on the output mode selected. Individual samples and fixed pitch parameters are "activated" through reception of note-on commands, and are "deactivated" by note-off commands, or by completing the digital content of non-looped samples. During the processing cycle, each active sample is first processed by a pitch filter, then by a volume filter. The filter parameters are unique to each active sample, and include fixed patch parameters and variable pitchbend and volume changes stemming from incoming channel and individual-note commands or through application of special preset algorithmic parameter controls. The output of the volume filter is then sent to panning mixers, where it is processed for panning and mixed with the output of other active samples. At the completion of the processing cycle, the resulting mix is sent to a maximum of three auxiliary buffers, and then forwarded to the sound card.

The synthesizer of the present invention is capable of supporting four separate channel outputs for the purpose of generating in surround sound format and six separate channel outputs for the purpose of emulating instrument placement in specific seating arrangements for large ensembles, unlike prior art systems. The synthesizer also supports an "active" score playback mode, in which an auxiliary buffer is maintained, and the synthesizer receives timing information for each event well in advance of each event. The instrument buffers are dynamically created in response to instrument change commands in the performance generation code. This feature enables the buffer to be ready ahead of time, and therefore reduces latency. The synthesizer also includes an automatic crossfading feature that is used to achieve a legato connection between consecutive notes in the same voice. Legato crossfading is determined by the compiler from information in the score.

Accordingly, the present invention integrates music notation technology with a unique performance generation code and a synthesizer pre-loaded with musical instrument files to provide realistic playback of music scores. The user is able to generate and playback scores without the need of separate synthesizers, mixers, and other equipment.

Certain modifications and improvements will occur to those skilled in the art upon a reading of the foregoing description. For example, the performance generation code is not limited to the examples listed. Rather, an infinite number of codes may be developed to represent many different types of sounds. All such modifications and improvements of the present invention have been deleted herein for the sake of conciseness and readability but are properly within the scope of the following claims.

What is claimed is:

1. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the user interface enables the user to double-click on a musical character in the musical score to cause that musical character to become a new cursor character such that the musical character is morphed.

2. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the user interface enables the user to enter a desired time span for performance of the musical score and wherein a tempo for the musical score is automatically calculated based on the input time span.

3. The system of claim 2 wherein tempo nuances of musical notes in the musical score are preserved by adjusting the musical note values in accordance with the calculated tempo.

4. The system of claim 2 wherein when the user enters a desired time span for performance of the musical score, the system performs at least one calculation on a stored duration of each timed event within the musical score to arrive at a correct timing for the entire musical score.

5. The system of claim 4 wherein the duration of each timed event is preferably calculated in units of $\frac{1}{44100}$ of a second.

6. The system of claim 4 wherein the each stored duration of each timed event is adjusted by a factor x, wherein x equals a current duration of the musical score divided by the user's desired duration of the musical score.

7. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the database enables the system to read music XML files and convert them into the data structure and vice versa.

8. The system of claim 7 wherein XML tags in an XML music file are stored as a single table and pointers are substituted for the XML tags.

9. The system of claim 7 wherein the XML tags used most often are designated a low number to minimize the number of bits used in the pointer.

10. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a musical font comprising glyphs with corresponding hexadecimal codes that are assigned to each musical character in the musical score;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples.

11. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a musical font comprising a numbering system that corresponds to the musical characters;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein system mathematically calculates numbers in the numbering system of the musical font to manipulate the musical characters.

12. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data is in an event-sequence form.

13. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises instrument change commands providing for a plurality of instruments and a variety of samples related to each instrument.

14. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises sample preloading commands that allow samples to be released from memory when they are no longer needed.

15. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises note-on commands that specify envelope shaping of individual musical notes.

16. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises note-off commands that specify decay shape of individual musical notes.

17. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises pitch bend commands that support algorithmic pitch bend shaping.

18. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises pan commands that apply surround sound panning to individual musical notes.

19. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises pedal commands that indicate, on an individual note basis, whether to turn a pedal effect on or off.

20. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generation data comprises timing commands that enable timing independent of any computer clock.

21. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the performance generator influences a tempo of the musical score without affecting execution of events in the musical score, based on real-time user input.

22. The system of claim 21 wherein marks are placed in a rhythm control staff in the musical score to cause the tempo to return to the current notated tempo or a previously-captured tempo from a previous user-controlled session.

23. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein user input from MIDI notates rhythms irrespective of a tempo at which notes in the musical score are played.

24. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the acoustical data is processed by a single pitch filter and a single volume filter.

25. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the synthesizer maintains a buffer so that it receives information for each event in the musical score in advance of the moment at which such event is to be heard, to reduce latency in performance.

26. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein events that are to occur simultaneously during the performance of the musical score are grouped together and assigned a single timing value.

27. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the synthesizer preassembles acoustical data from the musical score, prior to the moment at which the acoustical data is to be performed, to enable simultaneous performance of musical notes in a single timed event in the musical score such as a chord.

28. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the system enables the user to assign a digital sound sample from the library of digital sound samples to each musical note in the musical score based on factors selected from the group consisting of the type of musical instrument, playing technique, articulation of the musical note, loudness of the musical note, and length of the musical note.

29. A system for creating and performing a musical score comprising:

a user interface that enables a user to enter the musical score into the system and displays the musical score;

a database that stores a data structure which supports graphical symbols for musical characters in the musical score and performance generation data that is derived from the graphical symbols;

a performance generator that synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the musical score is recorded to a storage medium as an audio data file and wherein a plurality of types of control information can be encoded within the audio data file by alternating chunks of audio data with chunks of synchronization data whose location is defined by the length of the audio data chunks.

30. A system for creating and performing a musical score comprising:

a user interface that enables a user to enter the musical score into the system and displays the musical score;

a database that stores a data structure which musical characters in the musical score and performance generation data that is derived from the musical characters;

a performance generator that reads the performance generation data and synchronizes the performance of the musical score with the display of the musical score; and a synthesizer that responds to commands from the performance generator and creates data for acoustical playback of the musical score that is output to a sound generation device;

wherein the synthesizer generates the data for acoustical playback of the musical score from a library of digital sound samples; and wherein the synthesizer maintains a buffer so that it receives information for each event in the musical score in advance of the moment at which such event is to be heard, to reduce latency in performance.

* * * * *

UNITED STATES PATENT AND TRADEMARK OFFICE

CERTIFICATE OF CORRECTION

PATENT NO. : 7,589,271 B2
APPLICATION NO. : 11/262312
DATED : September 15, 2009
INVENTOR(S) : Jarrett et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 972 days.

Signed and Sealed this

Twenty-first Day of September, 2010

David J. Kappos
*Director of the United States Patent and Trademark Office*